United States Patent [19]
Wang et al.

[11] Patent Number: 5,045,498
[45] Date of Patent: Sep. 3, 1991

[54] METHOD OF FABRICATING AN ATOMIC ELEMENT DOPED SEMICONDUCTOR INJECTION LASER USING ION IMPLANTATION AND EPITAXIAL GROWTH ON THE IMPLANTED SURFACE

[75] Inventors: Shih-Yuan Wang, Palo Alto; Michael R. T. Tan, Mountain View, both of Calif.

[73] Assignee: Hewlett-Packard Company, Palo Alto, Calif.

[21] Appl. No.: 565,532

[22] Filed: Aug. 10, 1990

[51] Int. Cl.$^5$ ............................................. H01L 21/20
[52] U.S. Cl. ........................... 437/129; 148/DIG. 95; 437/23
[58] Field of Search ............ 437/129, 22, 23; 372/45; 148/DIG. 95, DIG. 169

[56] References Cited

U.S. PATENT DOCUMENTS 4,737,960  4/1988  Tsang ................................... 372/45
4,928,285  5/1990  Kushibe et al. ....................... 372/45

OTHER PUBLICATIONS

J. P. van der Ziel, et al., "Single Longitudinal Mode Operation of Er-Doped 1.5 μm InGaAsP Lasers", Appl. Phys. Lett. 50(19), May 11, 87, p. 1313.
W. T. Tsang et al., "Observation of Enhanced Single Longitudinal Mode Operation in 1.5 μm GaInAsP Erbium-Doped Semiconductor Injection Lasers", Appl. Phys. Lett. 49(25), 22 Dec. 1986, p. 1686.

*Primary Examiner*—Brian E. Hearn
*Assistant Examiner*—Brian E. Fleck

[57] ABSTRACT

A semiconductor laser diode includes a first buffer layer, a second buffer layer and an active layer sandwiched between the two buffer layers. The active layer contains dopant ions where the dopant ions are such that energy transfer between the unimplanted material in the active layer and the dopant ions implanted causes lasing action substantially at a single frequency characteristic of the dopant ions. The two buffer layers confine light emitted by the active layer. The second buffer layer is grown epitaxially on the active layer. In the preferred embodiment, the structure is made by first growing a thin second buffer layer epitaxially on the active layer. The dopant ions are then implanted into the active layer through the thin second buffer layer. The structure is heated to a high temperature to anneal the structure and to activate the dopants. The second buffer layer is then further grown to make it thicker so as to be more effective in confining the light emission in the active layer.

2 Claims, 1 Drawing Sheet

METHOD OF FABRICATING AN ATOMIC ELEMENT DOPED SEMICONDUCTOR INJECTION LASER USING ION IMPLANTATION AND EPITAXIAL GROWTH ON THE IMPLANTED SURFACE

BACKGROUND OF THE INVENTION

This invention relates in general to semiconductor lasers and in particular, to a semiconductor injection laser whose active region is doped by ions such as rare earth ions to produce a single frequency semiconductor laser.

Single frequency lasers are of great practical importance in coherent optical telecommunication and other applications such as instruments. A number of techniques have been proposed for achieving single frequency lasers. One basic approach is to couple a laser which emits light within a bandwidth of frequencies with a filter in a feedback path in order to enhance light emission at a discrete resonant optical frequency. However, the fabrication of these distributed feedback lasers is complicated resulting in low yield.

One of the most elegant and simple techniques to achieve a single frequency laser is to dope a semiconductor junction with erbium ions. In this technique, erbium ions are introduced into the semiconductor through ion implantation, molecular beam epitaxy or liquid phase epitaxy. The erbium ions are excited when the host semiconductor is either optically or electrically excited/injected with electrons and holes. The exact nature of energy transfer between the erbium and the electrons/holes is unknown. However, when the erbium ions are excited by optically or electrically exciting/injecting the host semiconductor by electrons and holes, the erbium emits light at its atomic transition of approximately 1.54 microns. This atomic linewidth is potentially extremely narrow. Electroluminescence and photoluminescence of rare earth elements in compound semiconductor media such as indium phosphide and gallium arsenide are discussed by various publications by a number of authors. See, for example, the following:

1. H. Ennen et al., "Rare Earth Activated Luminescence in InP, GaP and GaAs" *J. Crystal Growth,* 64 (1983) 165–168.
2. A. G. Dmitriev et al., "Electroluminescence of Ytterbium-doped Indium Phosphide," *Soviet Phys. Semicond.,* 17(10) 1983, 1201.
3. W. T. Tsang et al., "Observation of Enhanced Single Longitudinal Mode Operation in 1.5 um GaInAsP Erbium-doped Semiconductor Injection Lasers," *Appl. Phys. Letters,* 49 (25), 1986, 1686–1688.
4. J. P. Van Der Ziel et al., "Single Longitudinal Mode Operation of Er-Doped 1.5 um InGaAsP Lasers," *Appl. Phys. Letters,* 50 (19) 1987, 1313–1315.

In the above-referenced article, Tsang and Logan matched the atomic transition of erbium with a semiconductor transition, with the atomic erbium transition energy slightly greater than the semiconductor (GaInAsP) transition. They reported single mode operation of the erbium-doped GaInAsP diode laser.

The technique used for incorporation of the rare earth ions into the semiconductor material is critical in developing a successful device. While liquid phase epitaxy and molecular beam epitaxy may be used, ion implantation offers better ion spatial distribution and doping control compared to liquid phase epitaxy or molecular beam epitaxy for the incorporation of these heavy ions. In both liquid phase epitaxy and molecular beam epitaxy, the erbium ions tend to cluster at heterojunction interfaces and cause inhomogeneities in the epitaxial layers (see reference 4 above).

In ion implantation, epitaxial layers are first grown and the rare earth ions then introduced through implantation. Therefore, the implanted ions will have minimal disturbance on the epitaxial quality. The ions are then activated by high temperature annealing. Since the rare earth elements are heavy, typically they are implanted only to shallow depths in the epitaxial layers. Hence they will remain close to the surface of the epitaxial layers. When excited, they will emit light at the linewidth of 1.54 microns. However, since they remain close to the surface of the epitaxial layers, it is difficult to confine the light emitted. It is therefore desirable to provide a semiconductor structure and system of manufacture in which such difficulties are overcome.

SUMMARY OF THE INVENTION

This invention is based on the observation that the surface of the epitaxially grown layers after the heavy rare earth ions have been implanted is not damaged significantly so that further epitaxial layers may be grown thereon to confine the light emitted by the rare earth ions.

The method of this invention for fabricating a semiconductor laser comprises providing a body of semiconductor material having a first buffer layer and an active layer on said first buffer layer and implanting dopant ions into said active layer of the body. The dopant is such that energy transfer between the unimplanted material in the active layer and the dopant ions implanted causes lasing action substantially at a single frequency characteristic of the dopant ions. The method further comprises annealing the body to activate the dopant ions and growing epitaxially a second buffer layer on said active layer, wherein the two buffer layers confine light emitted by said active layer. The buffer layers also act to confine the electrically injected carriers, as in conventional semiconductor diode lasers, to increase the quantum efficiency.

The semiconductor laser structure of this invention comprises a first buffer layer and an active layer on the first buffer layer (double heterostructure). The active layer contains dopant ions where the dopant ions are such that energy transfer between the unimplanted material in the active layer and the dopant ions causes lasing action substantially at a single frequency characteristic of said dopant ions. The structure further comprises a second buffer layer epitaxially grown on the active layer after the active layer has been doped. The two buffer layers confine light emitted by the active layer and also confine the current to increase quantum efficiency.

DETAILED DESCRIPTION OF THE INVENTION

Figure 1:
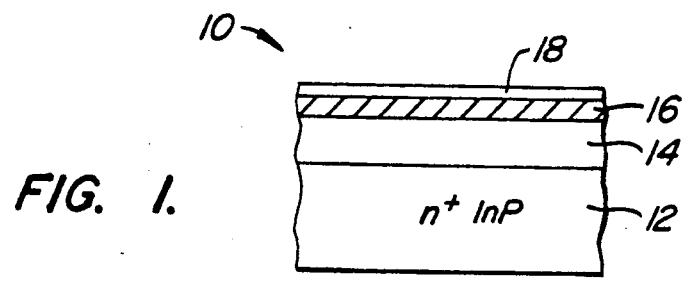
FIG. 1 is a cross-sectional view of a semiconductor structure with a substrate, a first buffer layer, an active layer, and a thin second buffer layer before ions are implanted to illustrate the preferred embodiment of the invention.

FIG. 1 is a cross-sectional view of a semiconductor structure to illustrate the invention. As shown in FIG. 1, a semiconductor structure 10 is provided which comprises a substrate layer 12, a first buffer layer 14, an active layer 16, and a thin second buffer layer 18. Structure 10 may be formed by starting with a substrate 12. The first buffer layer 14, the active layer 16, and the second buffer layer 18 are then grown sequentially onto substrate 12 epitaxially. While in the preferred embodiment, substrate 12 is used as the starting material, it will be understood that the buffer layer 14 may be used as the starting material instead with no substrate 12. As shown in FIG. 1, substrate 12 is made of n+InP and the first buffer layer 14 is composed of n−InP; active layer 14 is composed of GaInAsP and layer 18 is p−InP.

Layers 14 and 18 have smaller indices of refraction compared to active layer 16 in order to confine light emitted in layer 16 to the active layer. While the substrate, active and buffer layers are illustrated with the above-described composition, it will be understood that these layers may be made of other semiconductor materials instead. Thus these layers may be made from a group III-V semiconductor material which may be GaAs, InGaAs, InGaAsP, AlGaInAs, AlGaAs, AlGaInP or GaInP. Various combinations of these materials may be used for the different layers in structure 10 provided that the bandgap of layer 16 matches approximately the dopant ions as described below and that the indices of refraction of the buffer layers 14, 18 are smaller than that of active layer 16 to confine the propagation of the light emitted from layer 16. Still other types of semiconductor materials may be used for the layers 12-18. All such configurations are within the scope of the invention.

Figure 2:
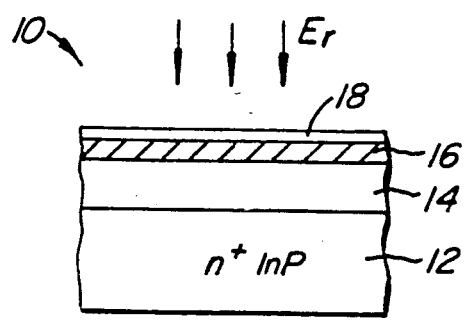
FIG. 2 is a cross-sectional view of a semiconductor structure illustrating the structure of FIG. 1 and the implantation of erbium ions to dope the active layer of the structure.

Structure 10 of FIG. 1 is one structure one may start with for constructing the desired single frequency semiconductor laser diode. Other structures include, for example, the V-groove type configuration. A surface emitting laser may also be constructed using the system described below. The next step is illustrated in FIG. 2. As shown in FIG. 2, erbium (Er) ions are caused to impinge the thin buffer layer 18 of structure 10. The thickness of layer 18 and the energy of impinging erbium ions are chosen so that the resulting erbium doping is maximum within the active layer 16. As discussed above, erbium ions have heavy mass so that they do not penetrate deep into structure 10. Since layer 18 is chosen to be thin, even the heavy erbium ions can readily penetrate to reach the active layer 16 so that the concentration of erbium is maximized within layer 16.

In order for the resulting structure to be more effective in confining the propagation of light within the active layer 16, it is desirable for the second buffer layer 18 to be thick. If layer 18 before the implantation of erbium ions is thick, the erbium dopants will not be able to reach the active layer 16. By choosing a second buffer layer 18 which is thin, it is then possible for the erbium ions to be implanted in the active layer. This invention is based on the observation that the second buffer layer 18 may be made thicker after the erbium ions have been implanted. However, before the second buffer layer can be thickened, the erbium ions implanted are first activated by heating structure 10 to an elevated temperature for annealing. Such annealing process is known to those skilled in the art.

In order for a thicker second buffer layer to be formed on top of structure 10, it is necessary to further epitaxially grow layer 18 so that it has the desired thickness in order to confine the propagation of light within layer 16. Ion implantation in many processes frequently causes damage to the surface of a structure to the extent that epitaxial growth can no longer occur without annealing. In some cases, the surface damage due to ion implantation is not significant, so that good epitaxial layers may be grown prior to annealing. Hence it may be possible to anneal after the second buffer layer 18 is thickened. With composition of structure 10 as described above, however, for certain dose and energy the implantation of erbium ions does not cause damage to the surface of layer 18 to the extent that epitaxial growth cannot occur. Hence layer 18 can be thickened to become layer 18' through an epitaxial growth process. A further contact layer composed of GaInAsP may be grown on top of the finished second buffer layer 18' as shown in FIG. 3.

Figure 3:
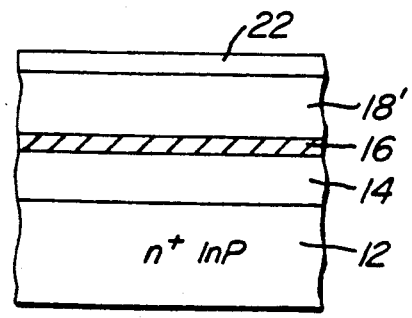
FIG. 3 is the semiconductor structure arrived at from that of FIG. 2 after further epitaxial growth of the second buffer layer and of a contact layer.
Figure 4:
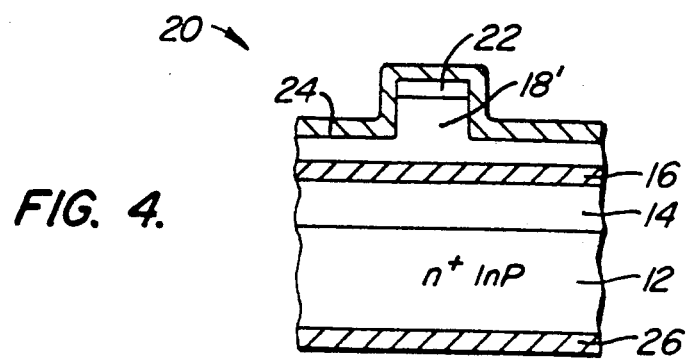
FIG. 4 is a cross-sectional view of a semiconductor structure to illustrate a device arrived after further epitaxial growth of contact layers to complete the fabrication of the semiconductor laser diode.

FIG. 4 is a cross-sectional view of the semiconductor structure of FIG. 3 after further processing to add ohmic contact layers. As shown in FIG. 4, the contact layer 22 and a portion of the second buffer layer 18' are etched and a P-ohmic contact layer 24 is deposited on top thereof to form a simple ridge structure. A N-ohmic contact layer 26 is deposited underneath the substrate 12. While in the preferred embodiment, the contact layer 22 is grown epitaxially, it will be understood that contacts other than that grown epitaxially may also be used and are within the scope of the invention, such as metal ohmic contact layers deposited by evaporation.

Structure 20 of FIG. 4 may be electrically or optically excited/injected with the creation of electrons and holes. The energy transfer between the electrons/holes and the erbium ions present in active layer 16 causes the erbium to emit at its atomic transition of 1.54 microns. While the exact nature of the energy transfer is unknown, the single frequency emission has been observed and is potentially extremely narrow.

Dopants other than erbium may also be used, such as another rare earth dopant, such as neodymium or ytterbium. The dopant may even be a non-rare earth element where single frequency emission at other frequencies is desired. All such combinations are within the scope of the invention.

While it is preferable to employ a structure 10 having a thin second buffer layer 18 in addition to the first buffer layer 14 and the active layer 16, it will be understood that the second thin buffer layer is not required for the invention. Thus even if layer 18 is eliminated from the structure 10, the implantation of erbium ions, the growth of the second buffer layer 18' and of contact layers may be formed in exactly the same manner as described above.

While the invention has been described by reference to specific illustrations above, it will be understood that various modifications and changes may be made without departing from the scope of the invention which is to be limited only by the appended claims.

What is claimed is:

1. A method for fabricating a semiconductor laser, comprising:

providing a body of semiconductor material having a first buffer layer and an active layer on said first buffer layer;

implanting dopant ions into said active layer of said body, said dopant being such that energy transfer between the unimplanted material in the active layer and the dopant ions implanted causes lasing action substantially at a single frequency characteristic of said dopant;

annealing the body to activate the dopant ions; and growing epitaxially a second buffer layer on said active layer, wherein said two buffer layers confine light emitted by said active layer.

2. The method of claim 1, said body having a substrate layer supporting the first buffer layer, said method further comprising growing contact layers epitaxially on said second buffer layer and on said substrate.